United States Patent [19]
Kim et al.

[11] Patent Number: 6,002,170
[45] Date of Patent: Dec. 14, 1999

[54] CHIP CARRIER WITH EMBEDDED LEADS AND CHIP PACKAGE USING SAME

[75] Inventors: Sun-Dong Kim, Seoul; Byong-Su Seol, Choongchungbook-do, both of Rep. of Korea

[73] Assignee: LG Semicon Co., Ltd., Cheongju, Rep. of Korea

[21] Appl. No.: 08/687,929

[22] Filed: Jul. 29, 1996

[30] Foreign Application Priority Data

Jul. 28, 1995 [KR] Rep. of Korea ................. 95-22839

[51] Int. Cl.[6] .................................................. H01L 23/04
[52] U.S. Cl. ..................... 257/698; 257/692; 257/686; 257/690
[58] Field of Search ................................. 257/666, 698, 257/685, 686, 679, 700, 720, 706, 704, 692, 773, 726, 723, 724, 707, 690

[56] References Cited

U.S. PATENT DOCUMENTS

| | | |
|---|---|---|
| 3,947,867 | 3/1976 | Duffek ........................................ 357/70 |
| 4,551,746 | 11/1985 | Gilbert et al. . |
| 4,654,694 | 3/1987 | Val ........................................ 257/724 |
| 4,857,988 | 8/1989 | Fottler . |
| 5,041,899 | 8/1991 | Oku et al. . |
| 5,095,402 | 3/1992 | Hernandez et al. . |
| 5,124,783 | 6/1992 | Sawaya ...................................... 257/724 |
| 5,455,384 | 10/1995 | Ichihara .................................... 257/698 |
| 5,490,324 | 2/1996 | Newman .................................... 257/686 |
| 5,523,622 | 6/1996 | Harada et al. ............................ 257/698 |
| 5,559,364 | 9/1996 | Hojyo . |
| 5,574,309 | 11/1996 | Papapietro et al. ....................... 257/679 |
| 5,600,101 | 2/1997 | Sakai ........................................ 257/698 |
| 5,604,328 | 2/1997 | Kubota et al. ............................ 257/686 |
| 5,608,265 | 3/1997 | Kitano et al. ............................. 257/685 |

FOREIGN PATENT DOCUMENTS 2-60149  2/1990  Japan .

*Primary Examiner*—Sheila V. Clark
*Attorney, Agent, or Firm*—Fleshner & Kim

[57] ABSTRACT

A chip package includes a flat plate body or carrier with a plurality of leads embedded therein but exposed at the first and second surfaces, e.g., the top and bottom surfaces, of the plate body. The body has a predetermined shape and may include a recess formed in the upper surface of the body to a prescribed depth. A semiconductor chip is mounted on the upper surface of the plate body or carrier. Metallic bonding wires electrically connect the leads of the body with the bonding pads of the chip, and an epoxy molding compound seals a predetermined portion including the chip, the leads, and the metallic wires. A plurality of like chip packages may be vertically stacked. Instead of epoxy molding, a thin lid having leads similarly embedded therein may be attached to the upper surface of the body.

23 Claims, 8 Drawing Sheets

CHIP CARRIER WITH EMBEDDED LEADS AND CHIP PACKAGE USING SAME

TECHNICAL FIELD

The present invention relates to a package for an IC chip, and more particularly, to a chip package with a plate body/carrier having a plurality of leads embedded therein and exposed at first and second surfaces, e.g., the top and bottom surfaces.

BACKGROUND ART

FIG. 1 shows a cross-sectional view of a Quad Flat Package, in which a semiconductor chip 3 is mounted on a paddle 2 of a lead frame 1. The chip 3 is electrically connected to inner leads 1a of the lead frame 1 by bonding wires 4, and the entire whole body 5 except for outer leads 1b is encapsulated by an epoxy molding compound.

The Quad Flat Package is disadvantageous since precise alignment of the outer leads 1b onto the bonding pads of a printed circuit board (PCB) is difficult. Further, the outer leads 16 may be damaged or deformed due to external impacts during the lead-forming process in which the outer leads 16 are bent into prescribed shapes. The repairing of the chip package defects when mounted on a PCB has been troublesome, and simplification of the process, as well as the increase in the number of package pins, has suffered limitation.

DISCLOSURE OF THE INVENTION

An advantage of the present invention is in prevention and protection of leads from damage due to external stress or impact.

Another advantage of the present invention is in allowing a chip package to be easily repaired.

A further advantage of the present invention is in improving the productivity of chip package manufacture.

The advantages and others are achieved in part by a component for forming a package for an integrated chip, comprising: an insulative member having a predetermined shape and a first surface for mounting the integrated chip, and a second surface serving as an outer surface of the package; and a plurality of first metallic members embedded within the insulative member for conductive connection to the integrated chip.

The present invention is achieved in part by a package, comprising: a) an integrated chip having a plurality of pads; b) an insulative member having a predetermined shape and a first surface for mounting the integrated chip, and a second surface serving as an outer surface of the package; c) a plurality of first metallic members embedded within the formed in the insulative member; d) means for conductive connection between the pads and plurality of first metallic members; and d) means for packaging the integrated chip, connection means, and portions of the first metallic members connected to the connection means.

The above advantages and others are achieved in part by a chip package comprising a body of predetermined thickness, whose upper surface is formed into a prescribed shape, a plurality of leads vertically embedded in the body but exposed at both the top and bottom surfaces of the body, a chip or chips attached to the upper side of the body, multiple bonding pads being provided on the chip or chips, metallic wires electrically connecting the leads of the body to the multiple bonding pads on the chip or chips, and an epoxy molding compound which seals a predetermined part of the body including the chip or chips, the multiple leads and metallic wires.

In accordance with another embodiment of the invention, an improved chip package is provided which includes a body terraced to a predetermined depth into a prescribed shape along its upper side, with a plurality of leads being embedded therein but exposed at both the top and the bottom surfaces thereof, a chip or chips attached onto the upper side thereof, bonding pads being provided on the chip or chips, metallic wires electrically connecting the leads to the multiple bonding pads on the chip or chips, and a lid which is electrically and sealingly connected to the body, which lid may be cut from the same kind of unit column frame from which the body is cut.

Additional advantages, objects and other features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

BEST MODE FOR CARRYING OUT THE INVENTION

Figure 1:
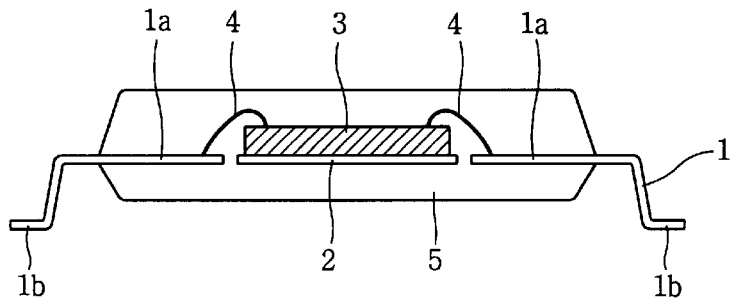
FIG. 1 is a cross-sectional view of a conventional semiconductor chip package.
Figure 2A:
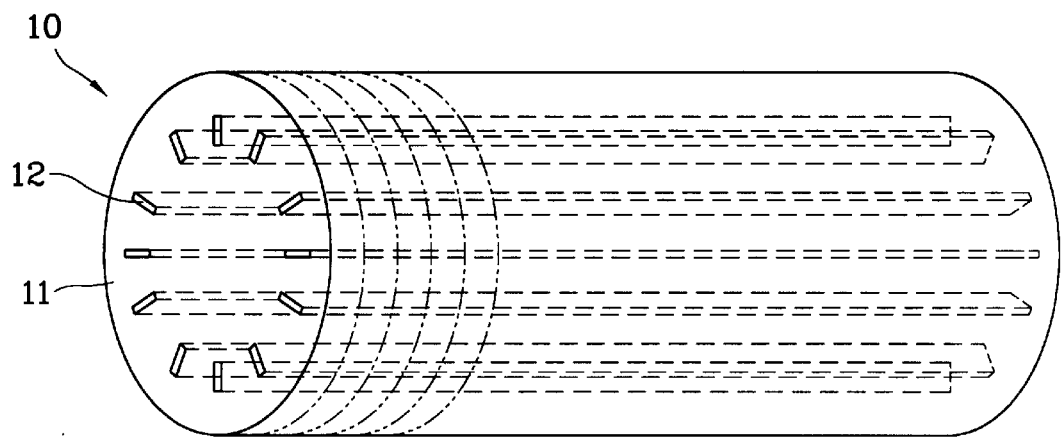
FIGS. 2A to 2B are perspective views of a unit column frame and a body cut therefrom, respectively, in accordance with an embodiment of the present invention.
Figure 2B:
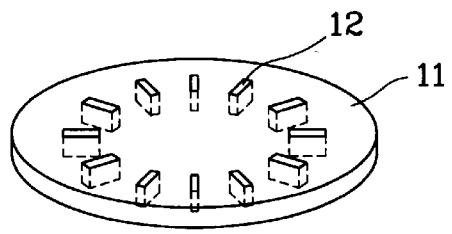

FIG. 2A is a perspective view of a unit column frame and FIG. 2B shows a plate formed therefrom. The unit column frame 10 has a cylindrical shape with a predetermined length. The body 11 is made of an insulating material with a plurality of leads 12 embedded vertically and radially therein and exposed at both the top and bottom surfaces for electrical connection to internal and external elements. The plates of FIG. 2B are sliced from the unit column frame of FIG. 2A at a prescribed thickness, such as 1 mm, 1.5 mm, 2 mm and the like, to manufacture semiconductor packages. As can be appreciated, each plate 11 of FIG. 2 may be otherwise formed by molding or the like, and the leads 12 embedded therein.

Figure 3A:
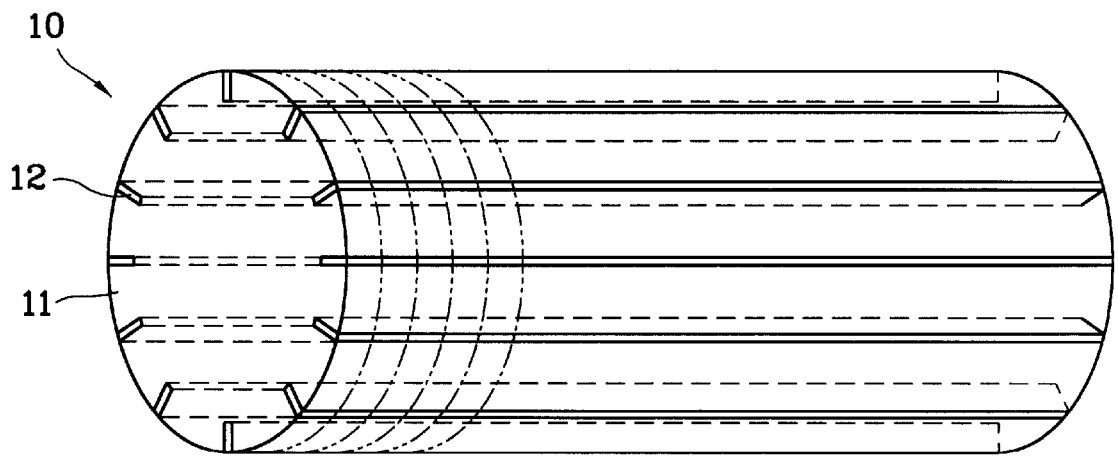
FIGS. 3A to 3B are perspective views of a unit column frame and a body cut therefrom, respectively, in accordance with another embodiment of the present invention.
Figure 3B:
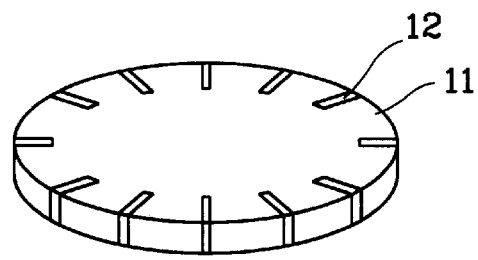

FIGS. 3A and 3B illustrate a unit column frame and a plate body sliced therefrom in accordance with another embodiment of the present invention. The unit column frame 10 has a predetermined length and is made of insulation material with a plurality of radially extending vertical leads 12 embedded therein so as to be exposed at the outer peripheral surfaces thereof. In addition to a cylinder type frame, various shapes of a unit column frame, such as a square pillar frame, can be made. Further, as can be appreciated, lead embedments different from the embodiments described above are possible.

FIGS. 4 through 7 illustrate various embedded-lead package types. The package plate bodies 11 may be of square or circular shape. Each plate body 11 has a plurality of radial leads 12 embedded therein but exposed at the peripheral surfaces thereof. The leads 12 are electrically and metallically wired to bonding pads of the semiconductor chips 15 mounted on the surface of the body 11. The broken lines 14 designate an epoxy compound molding, by which the portions inside the lines 14 are molded. An embedded-lead-type package is completed with an epoxy compound molding process after a wire bonding process.

Figure 6:
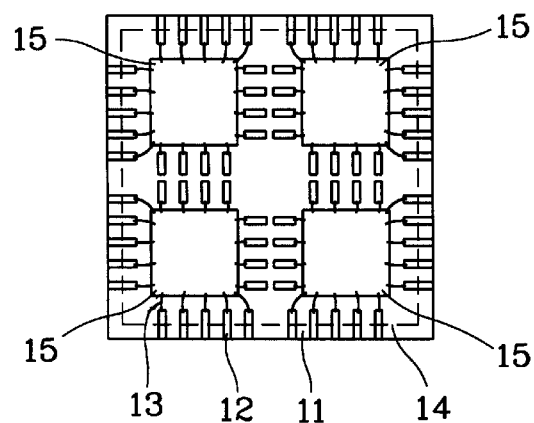

The plan view of FIG. 6 shows an embedded-lead chip package with multiple chips bondingly attached thereon. As shown, a plurality of leads 12 are embedded in the square plate body 11, on which multiple chips 15 are mounted, with the leads 12 arrayed surrounding each of the multiple chips 15. The leads 12 are electrically connected by metallic wires 13 to the bonding pads on the chips 15.

Figure 7:
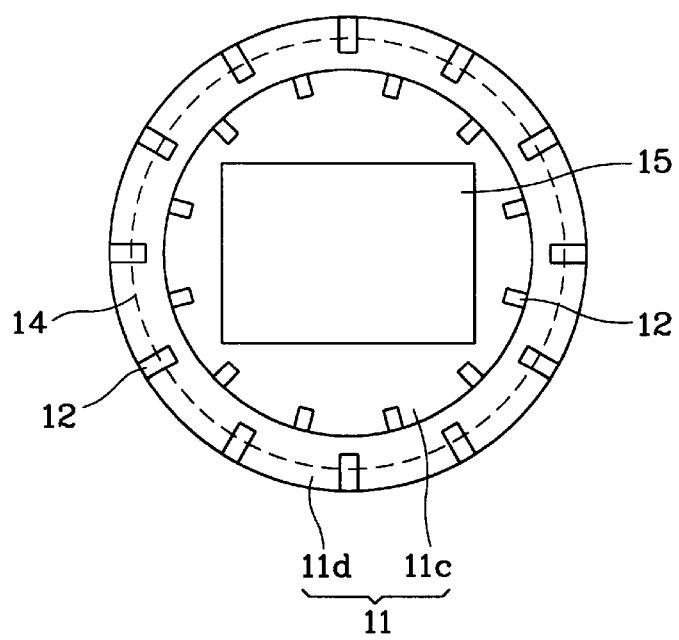

FIG. 7 illustrates another embodiment of the present invention. A dual structured package body 11 has a first body 11c embedded centrally into a second body 11d with a plurality of leads 12 embedded radially in each body (11c, 11d), but exposed at the outer surfaces of each body (11c, 11d). Such a dual structured body 11 increases the number of leads in a chip package.

Figure 8:
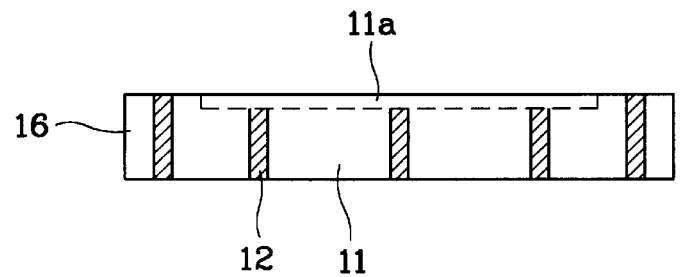
FIG. 8 is a cross-sectional view of a semiconductor chip package with a recess in accordance with another embodiment of the present invention.
Figure 9:
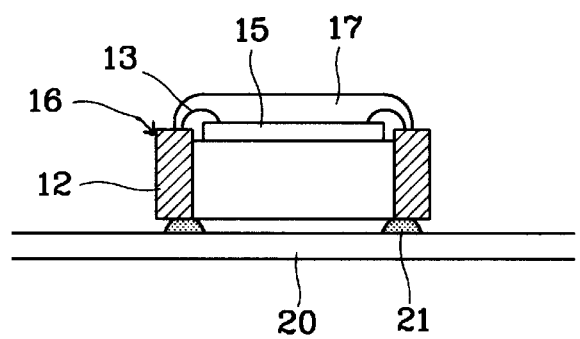
FIG. 9 is a cross-sectional view of a semiconductor chip package in accordance with another embodiment of the present invention mounted on the surface of a printed circuit board (PCB)
Figure 10:
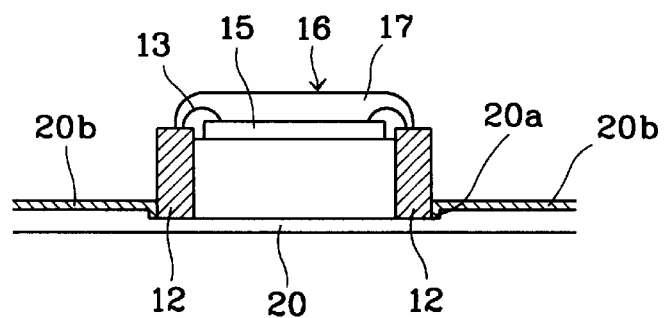
FIG. 10 is a cross-sectional view of a semiconductor chip package of the present invention mounted on a recessed surface of a PCB.

To reduce the thickness of a completed package, a recess 11a may be formed at a central portion of the plate body 11, as shown in FIG. 8. The semiconductor chip is mounted on the recessed central portion, as shown in FIGS. 9 and 10. The recess 11a may be formed by a grinding or polishing process.

FIG. 9 also shows a vertical cross-sectional view of a chip package 16 mounted on a PCB. The package 16 is aligned on a metallic pattern of the PCB 20 and the plurality of leads 12 are soldered to the metallic pattern of the PCB 20 using solder bumps 21. FIG. 10 is a vertical cross-sectional view of a chip package mounted insertingly in a PCB 20. A recess 20a formed in the upper surface of the PCB 20 fittingly holds the package 16, such that the leads 12 of the package 16 are electrically connected to the metallic pattern 20b of the PCB.

Figure 4:
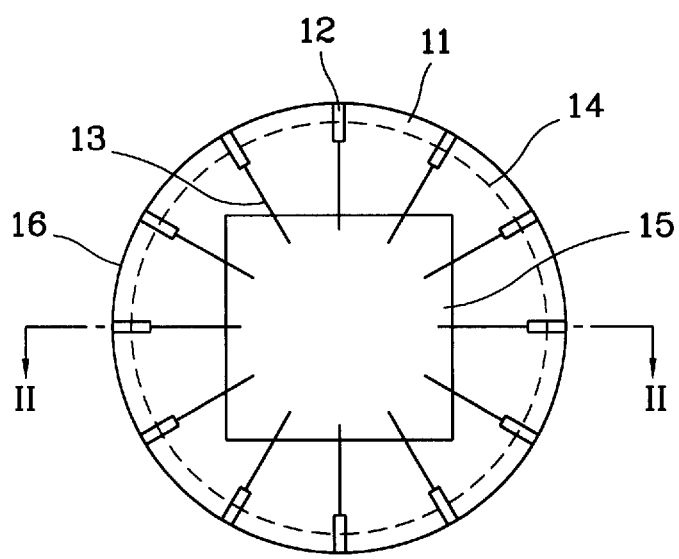
FIGS. 4 through 7 are plan views of various types of semiconductor chip packages in accordance with the present invention.
Figure 5:
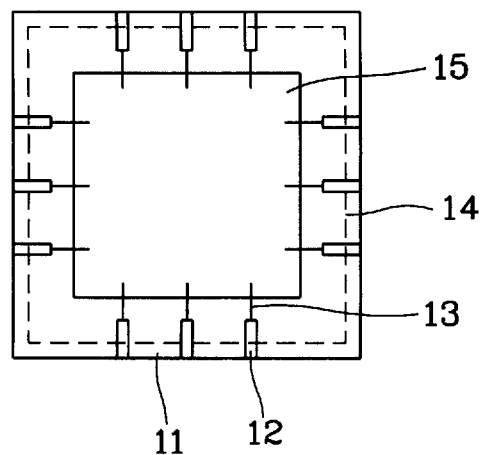
Figure 11:
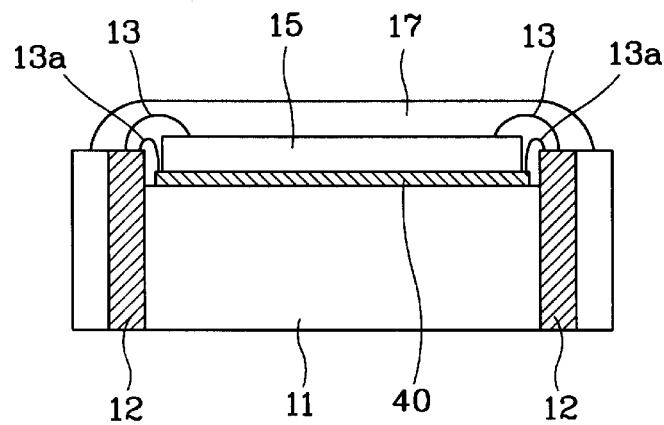
FIG. 11 is a cross-sectional view along line II—II of FIG. 4 with a capacitor provided in a semiconductor chip package.

FIG. 11 illustrates a cross-sectional view along the line II—II of FIG. 4 of a completed chip package after the epoxy compound molding 17 of a prescribed portion which contains the leads 12, the chip 15 and the metallic wires 13. A capacitor 40 is mounted in the recess 11a formed in the upper surface of the body 11. The semiconductor chip 15 is mounted on the capacitor 40. Also, the leads 12 are electrically connected to the chip 15 and capacitor 40, by metallic wires 13 and 13a respectively.

Figure 12:
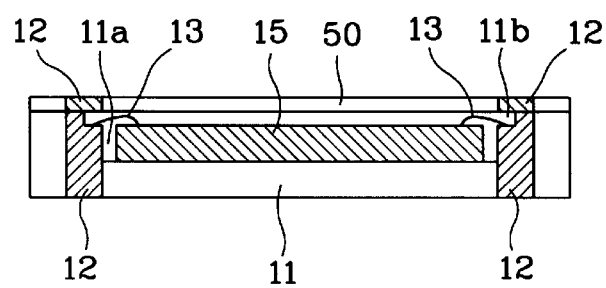
FIG. 12 is a cross-sectional view of a semiconductor chip package having a lid in accordance with another embodiment of the present invention.

FIG. 12 shows a plate body 11 with a plurality of leads 12 embedded therein, wherein a recess 11a is formed in a top central portion of the plate body 11, and a prescribed portion of the inner edge of a top of each of the plurality of leads 12 is ground down or cut off to a predetermined depth. A chip is mounted in the recess 11a. Also, the plurality of leads 12 with the cuts at the inner portions of the tops thereof are electrically connected to the bonding pads of the chip 15 by metallic wires 13. Instead of molding a prescribed portion of the body including metallic wires 13, the upper surface of the body 11 is covered using a lid 50 which may be sliced thinner than the body 11 from a unit column frame 10. The leads 12 of the lid 50 may be electrically connected to the corresponding leads 12 of the body 11 by soldering.

After completion of the wire bonding process, the upward protrusion of the metallic wires 13 still remains below the level of the upper surface of the body 11 before the recessing, so that the body lid 50 can be used rather than a molding compound. Alternately, epoxy compound molding can be substituted for the lid. As in the FIG. 11 embodiment, a capacitor 40 may be mounted in the recess 11a formed in the upper portion of the body, and a chip 15 mounted thereon. Afterward, the plurality of leads 12 are connected to the chip 15 and capacitor 40 by metallic wires 13, and the upper part of the body 11 can be covered by the lid 50.

Figure 13:
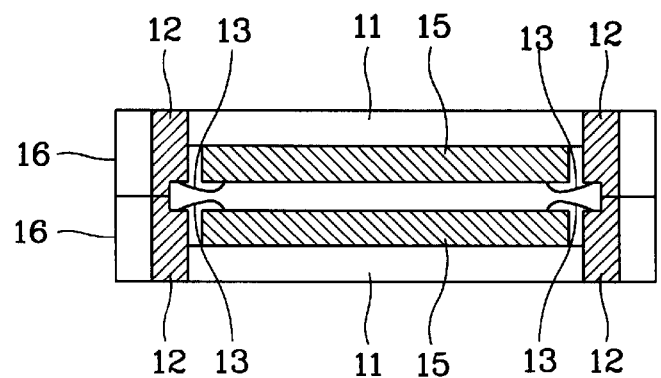
FIG. 13 is a cross-sectional view of a pair of semiconductor chip packages which are opposingly stacked and connected to each other.

In the FIG. 13 embodiment, two of the same packages of FIG. 12 without lids are opposingly stacked. On the upper surface of one package 16 is opposingly stacked another package of the same type, wherein the overall capacity is increased in accordance with the electrical connection of the leads of one package to those of the other.

Figure 14:
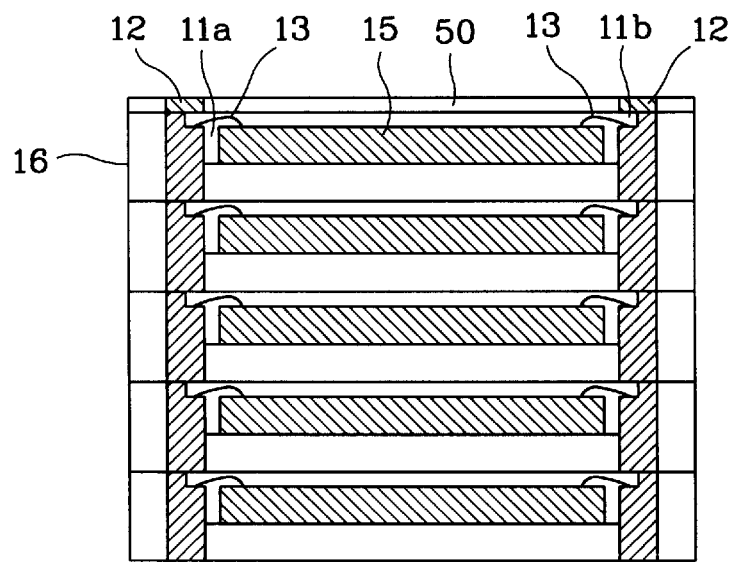
FIG. 14 is a cross-sectional view of a plurality of semiconductor chip packages stacked vertically with a lid provided on the top package thereof.
Figure 15:
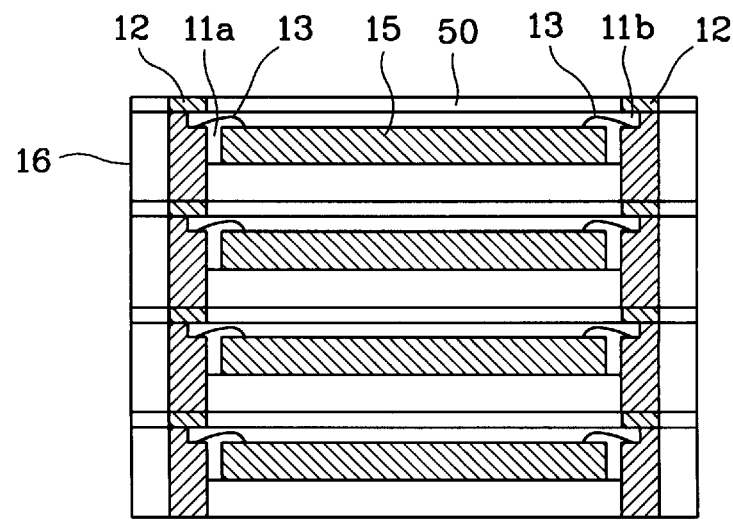
FIG. 15 is a cross-sectional view of a plurality of chip packages having lids stacked vertically atop one another.

FIG. 14 shows a state in which a plurality of the same packages of FIG. 12 are vertically stacked atop one another. The upper surface of the stack is covered with a lid 50, such as the one sliced from a unit column frame of FIG. 2. In FIG. 15, a plurality of covered packages, each of which is the same kind as shown in FIG. 12, are vertically stacked, so as to increase the overall capacity.

Figure 16:
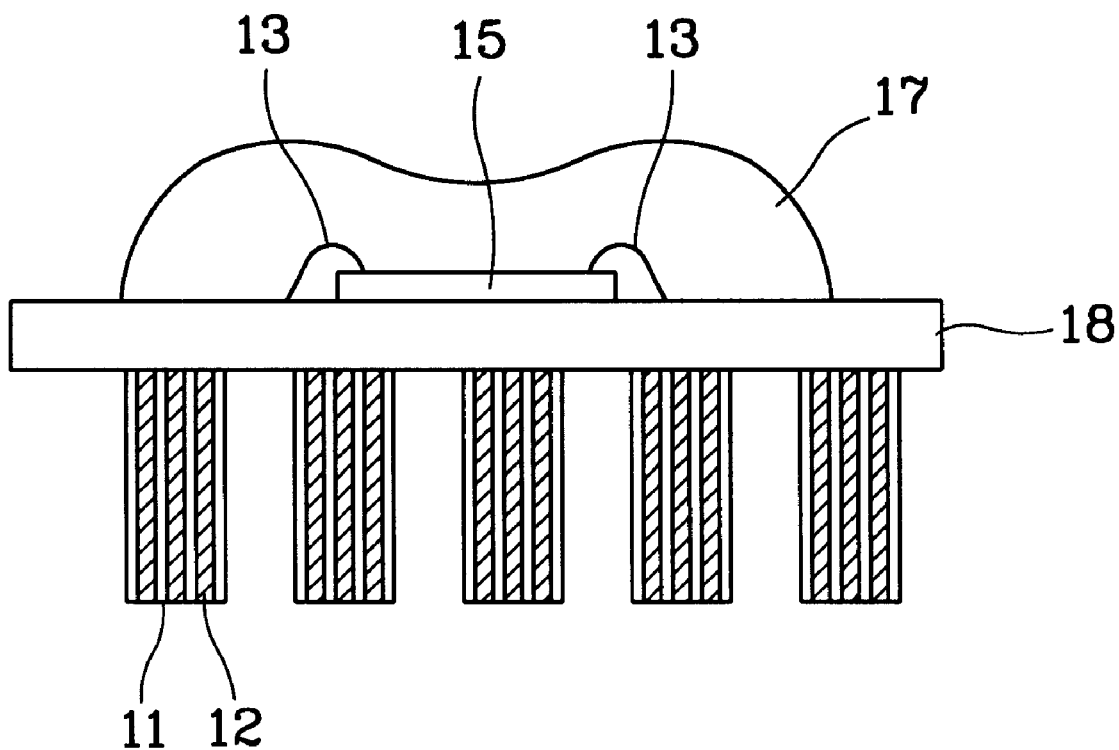
FIG. 16 is a cross-sectional view of a semiconductor chip package employing unit column frames of FIG. 2.

FIG. 16 shows an embodiment which is similar to a conventional Ball Grid Array structure, employing the unit column frame structure of FIG. 2. The package of FIG. 16 includes a substrate 18 with a metallic pattern (not illustrated) on the top and bottom surfaces thereof. A plurality of bodies 11 of lead-embedded unit column frames 10 is vertically attached at predetermined intervals to the metallic patterns on the bottom surface of the substrate 18. A semiconductor chip 15 is mounted on the surface of the substrate 18, and metallic bonding wires 13 electrically connect the chip 15 to the metallic pattern on the substrate 18. An epoxy molding compound 17 covers a prescribed portion containing the chip 15 and the metallic bonding wires 13. The above-described package enables the chip 15 to store data or read the stored data by electrically connecting the leads 12 embedded in the plurality of bodies 11 to the metallic pattern on a PCB (not illustrated).

As described above, the chip package of the present invention is composed of a plate body or bodies in which a plurality of leads lie embedded, a chip or chips mounted thereon, and wires which electrically connect the chip(s) to the leads. Hence, bending of the leads due to external stress/impact is prevented, since the leads, which function as connection elements to and from the exterior, are completely embedded and protected in an insulation body. Furthermore, the mounting process of such a chip package on a PCB becomes easier, due to the leads being exposed at both the top and the bottom surfaces of the body, and thus repairing of a defective package is much more easily facilitated. Subsequently, the cost is reduced by process simplification and improved productivity are expected with the elimination of the conventional lead forming and trimming process steps, which are performed in conventional semiconductor package manufacturing.

In the foregoing embodiments, the surfaces were referred to as upper and lower surfaces for convenience to illustrate the present invention in view of the figures. As can be appreciate, the surface reference is dependent upon the orientation of the package. Further, the foregoing embodiment is merely exemplary and not to be construed as limiting the present invention. The description of the present invention is intended to be illustrative, and not limiting the scope of the claims. However, one of ordinary skill in the art can readily package the chip with the top surface of the chip being exposed. Many alternatives, modifications and variations will be apparent to those skilled in the art.

We claim:

1. A chip package, comprising:
    an insulative flat body having a predetermined thickness and a prescribed shape;
    a plurality of vertically and radially-extending leads embedded in a plurality of recesses in the body, wherein ends of the leads have exposed end portions extending through both a top and bottom surface of the body;
    a semiconductor chip having multiple bonding pads provided thereon and mounted on the upper surface of the body;
    a plurality of conductive media electrically connecting the leads exposed at the upper surface of the body and the multiple bonding pads of the semiconductor chip; and
    an epoxy molding compound sealing a predetermined portion of the body including the chip, the leads exposed at the upper surface of the body and the conductive media.

2. The chip package of claim 1, wherein a recess is formed in an upper surface of the body and the chip is mounted within said recess.

3. The chip package of claim 1, wherein the body is composed of an electrical insulation material.

4. The chip package of claim 1, wherein a plurality of semiconductor chips are mounted on the body.

5. The chip package of claim 4, wherein a plurality of leads are embedded in the body so that leads surround each semiconductor chip mounted on the body.

6. The chip package of claim 1, wherein the body is disc-shaped.

7. The chip package of claim 6, wherein the leads are radially embedded in the body each at the same distance from a central axis of the body.

8. The chip package of claim 1, wherein the body is flat square-shaped.

9. The chip package of claim 6, wherein the leads are radially embedded in the body and side edges of said leads are exposed at a peripheral edge surface of the body.

10. The chip package of claim 8, wherein the leads are embedded in the body and side edges of said leads are exposed at a peripheral edge surface of the body.

11. The chip package of claim 1, wherein the body has a composite structure in which an inner sub-body is centrally embedded into an outer sub-body, and a plurality of leads are radially embedded in each of said sub-bodies at the same distance from a central axis of each said sub-body.

12. The chip package of claim 1, wherein a capacitor is inserted between the chip and the body, and a plurality of leads of the body are electrically connected by metallic bonding wires to said capacitor.

13. The chip package of claim 1, wherein a recess is formed in the upper surface of the body, and a recessed portion is formed at an inner top edge of each of the leads.

14. A chip package, comprising:
    an insulative flat body, having at least one recess formed to a predetermined depth in an upper portion thereof;
    a plurality of leads embedded in the body as a plurality of straight columns, wherein said leads have exposed end portions that extend through both the top and bottom surfaces of the body;
    at least one semiconductor chip, each having a plurality of bonding pads formed on an upper surface thereof and attached in the recess in the upper portion of the body;
    metallic wires electrically connecting the leads of the body and the bonding pads of the chip; and
    a flat lid sealingly attached onto the upper surface of the body, said lid having a plurality of leads correspondingly embedded therein and exposed at both a top and a bottom surface of the lid and electrically connected to the corresponding leads in the body.

15. A component for forming a package for an integrated chip, comprising:
    an insulative member having a predetermined shape and a first surface for mounting the integrated chip, and a second surface serving as an outer surface of the package; and
    a plurality of first metallic members embedded within said insulative member for conductive connection to the integrated chip, wherein said plurality of first metallic members have a depth extending from said first surface to said second surface of said insulative member, and wherein said plurality of first metallic members are embedded in and substantially fill a plurality of recesses in side surfaces of said insulative member such that said first metallic members have exposed end portions extending through the first surface, the second surface and the sides of said insulative member.

16. The component of claim 15, wherein said insulative member is a plate having one of a circular or square shape, and said first and second surfaces are top and bottom surfaces of said plate.

17. The component of claim 15, wherein said plurality of first metallic members are formed at a periphery of said insulative member.

18. The component of claim 15, wherein said first metallic members are embedded within said insulative member in a shape of a column.

19. The component of claim 15, wherein said insulative member includes a recess on said first surface for receiving the integrated chip.

20. The component of claim 15, further comprising a plurality of second metallic members embedded within said insulative member, wherein said plurality of first metallic members are embedded along a periphery of said insulative member, and said plurality of second metallic members are embedded at positions spaced inward from the periphery.

21. The chip package of claim 1, wherein the plurality of conductive media comprise a plurality of metallic wires.

22. The chip package of claim 14, wherein the plurality of leads embedded in the body are exposed along side surfaces of the body.

23. The chip package of claim 22, wherein the plurality of leads embedded in the flat sealing lid are exposed along side surfaces of the sealing lid.

\* \* \* \* \*